United States Patent
Chen et al.

(10) Patent No.: US 8,592,929 B2
(45) Date of Patent: Nov. 26, 2013

(54) SYMMETRICALLY SWITCHABLE SPIN-TRANSFER-TORQUE MAGNETORESISTIVE DEVICE

(75) Inventors: Wei-Chuan Chen, Taipei (TW); Kangho Lee, San Diego, CA (US); Xiaochun Zhu, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/360,530

(22) Filed: Jan. 27, 2012

(65) Prior Publication Data

US 2013/0062715 A1    Mar. 14, 2013

Related U.S. Application Data

(60) Provisional application No. 61/533,403, filed on Sep. 12, 2011.

(51) Int. Cl.
*H01L 29/82* (2006.01)
*G11C 11/02* (2006.01)

(52) U.S. Cl.
USPC .......... 257/421; 257/427; 257/E29.323; 438/3; 365/157; 365/158; 365/171; 365/172; 365/173; 360/324.2; 360/326

(58) Field of Classification Search
USPC ........ 257/20, 414, 421–427, E29.323; 438/3; 365/157–158, 171–173; 360/324–326, 360/313
See application file for complete search history.

(56) References Cited

U.S. PATENT DOCUMENTS

| | | | |
|---|---|---|---|
| 2007/0253123 A1* | 11/2007 | Freitag et al. | 360/324.12 |
| 2008/0094886 A1 | 4/2008 | Ranjan et al. | |
| 2010/0090301 A1 | 4/2010 | Lou et al. | |
| 2010/0226169 A1 | 9/2010 | Gao et al. | |
| 2010/0315863 A1 | 12/2010 | Zhu et al. | |
| 2010/0315869 A1 | 12/2010 | Min et al. | |
| 2011/0064969 A1* | 3/2011 | Chen et al. | 428/800 |

OTHER PUBLICATIONS

International Search Report and Written Opinion—PCT/US2012/054911—ISA/EPO—Jan. 30, 2013.

* cited by examiner

*Primary Examiner* — Jami M Valentine
(74) *Attorney, Agent, or Firm* — Sam Talpalatsky; Nicholas J. Pauley; Joseph Agusta

(57) ABSTRACT

A spin transfer torque magnetic random access memory (STT-MRAM) device includes magnetic tunnel junctions (MTJs) with reduced switching current asymmetry. At least one switching asymmetry balance layer (SABL) near the free layer of the MTJ reduces a first switching current Ic(p-ap) causing the value of the first switching current to be nearly equal to the value of a second switching current Ic(ap-p) without increasing the average switching current of the device. The SABL may be a non-magnetic switching asymmetry balance layer (NM-SABL) and/or a magnetic switching asymmetry balance layer (M-SABL).

19 Claims, 6 Drawing Sheets

SYMMETRICALLY SWITCHABLE SPIN-TRANSFER-TORQUE MAGNETORESISTIVE DEVICE

CROSS REFERENCE TO RELATED APPLICATION

The present application claims the benefit of U.S. provisional patent application No. 61/533,403.

TECHNICAL FIELD

The present disclosure generally relates to Magnetic Tunnel Junction (MTJ) devices. More specifically, the present disclosure relates to reducing asymmetric switching current in spin transfer torque magnetic random access memory (STT-MRAM) devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnitization direction that can be altered to represent either a "1" when the free layer magnetization is anti-parallel to the fixed layer magnitization or "0" when the free layer magnetization is parallel to the fixed layer magnitization or vice versa. One such device having a fixed layer, a tunneling layer, and a free layer is a magnetic tunnel junction (MTJ). The electrical resistance of an MTJ depends on whether the free layer magnitization and fixed layer magnitization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

BRIEF SUMMARY

Aspects of the present disclosure include a magnetic tunnel junction (MTJ), including a reference layer, a free layer and a tunnel barrier layer between the reference layer and the free layer. According to aspects of the present disclosure, the MTJ also includes at least one switching asymmetry balance layer (SABL) near the free layer. The switching asymmetry balance layer is configured to reduce switching current asymmetry of the MTJ.

According to another aspect, the present disclosure includes a method for forming a magnetic tunnel junction (MTJ). The method includes forming a reference layer, forming a tunnel barrier layer on the reference layer, and forming a free layer on the tunnel barrier layer. According to aspects of the present disclosure, the method also includes forming at least one switching asymmetry balance layer on the free layer. The switching asymmetry balance layer is configured to reduce switching current symmetry of the MTJ.

According to another aspect, the present disclosure includes a magnetic tunnel junction (MTJ) including a perpendicular magnetic anisotropy (PMA) reference layer, a PMA free layer, and a tunnel barrier layer between the PMA reference layer and the PMA free layer. According to aspects of the disclosure, the MTJ also includes at least one switching asymmetry balance layer (SABL) near the PMA free layer. The asymmetry balance layers are configured to reduce switching current asymmetry of the MTJ. A PMA promotion layer is between the switching asymmetry balance layer and the free layer.

In yet another aspect, an apparatus includes means for fixing magnetic polarization in a reference layer of an MTJ, means for altering magnetization direction in a free layer of the MTJ in response to a switching current, and means for reducing an asymmetry of the switching current This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

In STT-MRAM, the magnitude of switching current Ic(p-ap) sufficient to switch an MTJ from a parallel magnetic orientation to an anti-parallel magnetic orientation is greater than the magnitude of switching current Ic(ap-p) sufficient to switch an MTJ from an anti-parallel magnetic orientation to a parallel magnetic orientation. This asymmetry in switching current ("Ic asymmetry") may be defined as the ratio Ic(p-ap)/Ic(ap-p).

Ic asymmetry greater than about 1.2 or 1.25 may decrease reliability of STT-MRAM devices by reducing the read margin, for example. In STT-MRAM devices with parallel-anisotropy, in which the magnetic orientations of the pinned layer and free layer are parallel to the plane of the layers, Ic asymmetry may be in the range of about 1.2 to about 1.5. In STT-MRAM devices with perpendicular-anisotropy, in which the magnetic orientations of the pinned layer and free layer are perpendicular to the plane of the layers, Ic asymmetry may be in the range of about 3.0.

Aspects of the present disclosure provide a structure and method of constructing an MTJ with symmetric switching current Ic, or with reduced Ic asymmetry. In one configuration, the Ic asymmetry is below about 1.2 without increasing the magnitude of the switching current Ic.

A first current density, termed a "critical" current density Jc(p-ap), represents a lowest current density that causes the MTJ structure to switch from the first state to the second state ("p-ap"). A second "critical" current density Jc(ap-p) represents a lowest current density that causes the MTJ structure to switch from the second state to the first state ("ap-p"). Generally, p-ap switching involves greater current density than ap-p switching, i.e., Jc(ap-p)<Jc(p-ap). In addition, the asymmetry of the critical current densities tends to increase as the tunneling magnetoresistance (TMR) increases. Aspects of the present disclosure reduce or eliminate the asymmetry of these critical current densities and corresponding switching currents.

Figure 1:
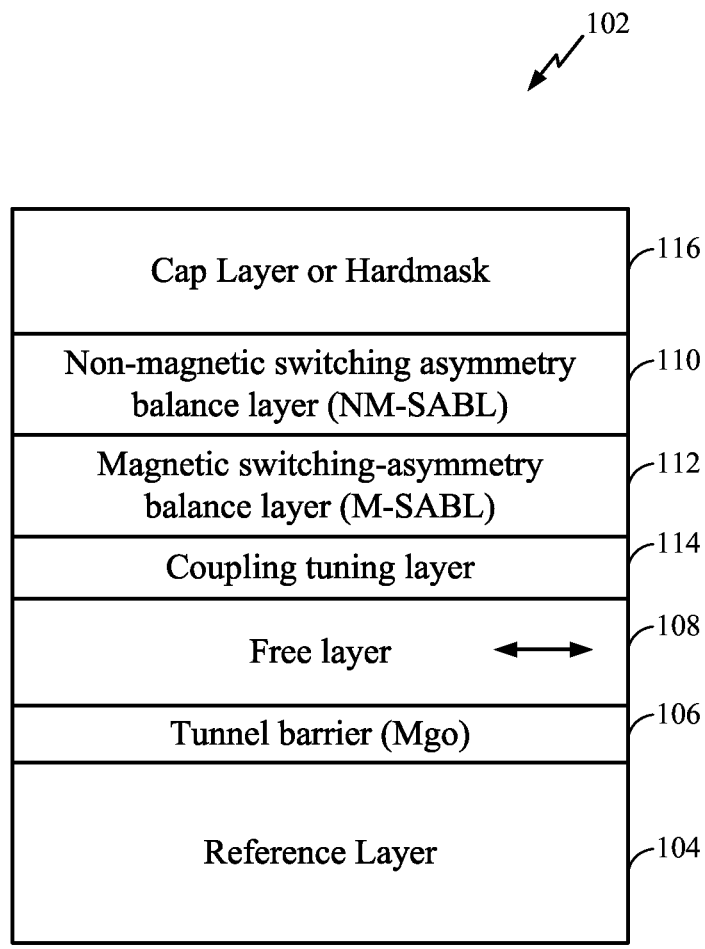
FIG. 1 is a cross-sectional diagram of a magnetic tunnel junction (MTJ) structure according to aspects of the present disclosure.

FIG. 1 is a cross-sectional diagram of a particular illustrative configuration of layers of a representative magnetic tunnel junction (MTJ) structure 102. In general, the MTJ structure 102 includes a fixed layer 104 (also referred to as a "reference" layer) and a tunnel barrier layer 106 deposited on the fixed layer 104. The fixed layer 104 may be anti-ferromagnetic and/or synthetic anti-ferromagnetic materials such as PtMn/(CoFe and/or CoFeB)/Ru/(CoFeB and/or CoFe), for example. The tunnel barrier layer 106 may be MgO. A free layer 108 is deposited on the tunnel barrier layer 106. The free layer 108 may include a single ferromagnetic material such as CoFeB or may be formed as a multilayer material such as CoFeB/CoFe, CoFeB/NiFe, CoFeB/FeB or CoFeB/Ta/NiFe, for example. According to aspects of the present disclosure, at least one non-magnetic switching asymmetry balance layer (NM-SABL) 110 is located near the free layer 108. In an illustrative configuration, the NM-SABL 110 may be a low resistance non-magnetic layer made from a material such as ultra-thin graded oxide including MgO, AlOx, RuOx, HfOx, TiOx or TaOx, with electrical resistance*area (RA) less than 5 ohm*$\mu m^2$.

Multiple additional layers may be included in the MTJ structure 102 according to aspects of the present disclosure. For example, a magnetic switching-asymmetry balance layer (M-SABL) 112 may also be near the free layer 108 and may be deposited between the free layer 108 and the NM-SABL 110. According to aspects of the present disclosure, the M-SABL 112 couples with the free layer to reduce Ic asymmetry. The M-SABL 112 may be a ferromagnetic material such as NiFe, Fe, FeB, Co, Ni or CoFe, for example. In an illustrative configuration, the M-SABL 112 may be a weakly ferromagnetic material or a super-paramagnetic material, for example. A coupling tuning layer 114 may optionally be deposited between the free layer 108 and the M-SABL 112. According to aspects of the present disclosure, the strength of coupling between the M-SABL 112 and the free layer 108 can be tuned by the coupling tuning layer 114. The coupling tuning layer 114 may be Ta, Ru, Ta/Ru, Ru/Ta, Ti, Mg, Cu, Cr, Al, Zr, Pt, Pd or Hf, for example. The MTJ structure 102 may also include a cap layer or hard mask 116 deposited over the MTJ layer stack.

The MTJ structure 102 can be configured to reduce or eliminate the Ic asymmetry and can improve thermal stability through coupling between the free layer 108 and the M-SABL 112. An Ic asymmetry of less than about 1.1 has been demonstrated by the MTJ structure 102. A process for fabricating the MTJ structure 102 according to aspects of the present disclosure does not involve difficult manufacturing steps and therefore may be used to produce STT-MRAM devices with good uniformity. The MTJ structure 102 can reduce Ic asymmetry by decreasing Ic(p-ap) and therefore does not involve increasing the average Ic. This can substantially reduce power consumption of an STT-MRAM device.

Figure 2:
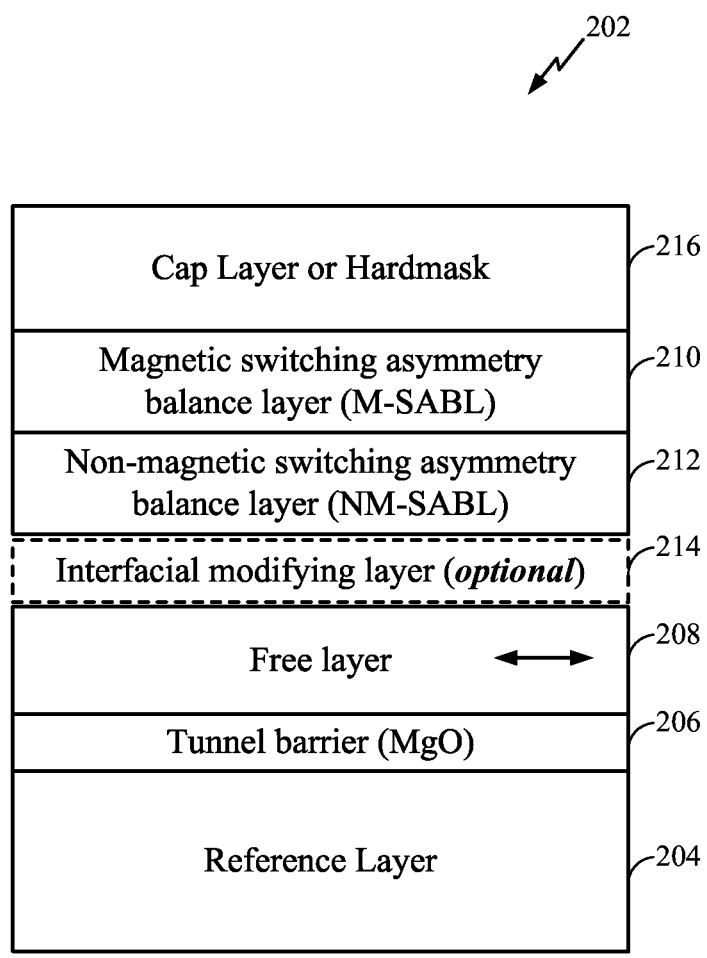
FIG. 2 is a cross-sectional diagram of a magnetic tunnel junction (MTJ) structure according to aspects of the present disclosure.

FIG. 2 is a cross-sectional diagram of a particular illustrative configuration of layers of a representative magnetic tunnel junction (MTJ) structure 202. In general, the MTJ structure 202 includes a fixed layer 204 and a tunnel barrier layer 206 deposited on the fixed layer 204. The fixed layer 204 may be anti-ferromagnetic and/or synthetic anti-ferromagnetic materials such as PtMn/(CoFe and/or CoFeB)/Ru/(CoFeB and/or CoFe), for example. The tunnel barrier layer may be MgO. A free layer 208 is deposited on the tunnel barrier layer 206. The free layer 208 may include a single ferromagnetic material such as CoFeB or may be formed as a multi-layer material such as CoFeB/CoFe, CoFeB/NiFe, CoFeB/FeB or CoFeB/Ta/NiFe, for example. According to aspects of the present disclosure, at least one magnetic switching asymmetry balance layer (M-SABL) 210 is near the free layer 208. In an illustrative configuration, the M-SABL 210 has a thickness of <20 Å and may be a ferromagnetic material such as NiFe, Fe, Ni, FeB, Co or CoFe, for example.

Multiple additional layers may be included in the MTJ structure 202 according to aspects of the present disclosure. For example, a non-magnetic switching-asymmetry balance layer (NM-SABL) 212 may also be near the free layer 208 and may be deposited between the free layer 208 and the M-SABL 210. The NM-SABL 212 may be a low resistance non-magnetic layer of a material such as ultra-thin graded oxide including MgO, AlOx, RuOx, TiOx, HfOx, or TaOx, with electrical resistance*area (RA) less than 5 ohm*$\mu m^2$. An interfacial modifying layer 214 may optionally be deposited between the free layer 208 and the NM-SABL 212. The interfacial modifying layer 214 may be materials such as Ta, Ru, Ta/Ru, Ru/Ta, Ti, Mg, Cu, Cr, Al, Zr, Pt, Pd or Hf, for example. The MTJ structure 202 may also include a cap layer or hard mask 216 deposited over the MTJ layer stack.

Figure 3:
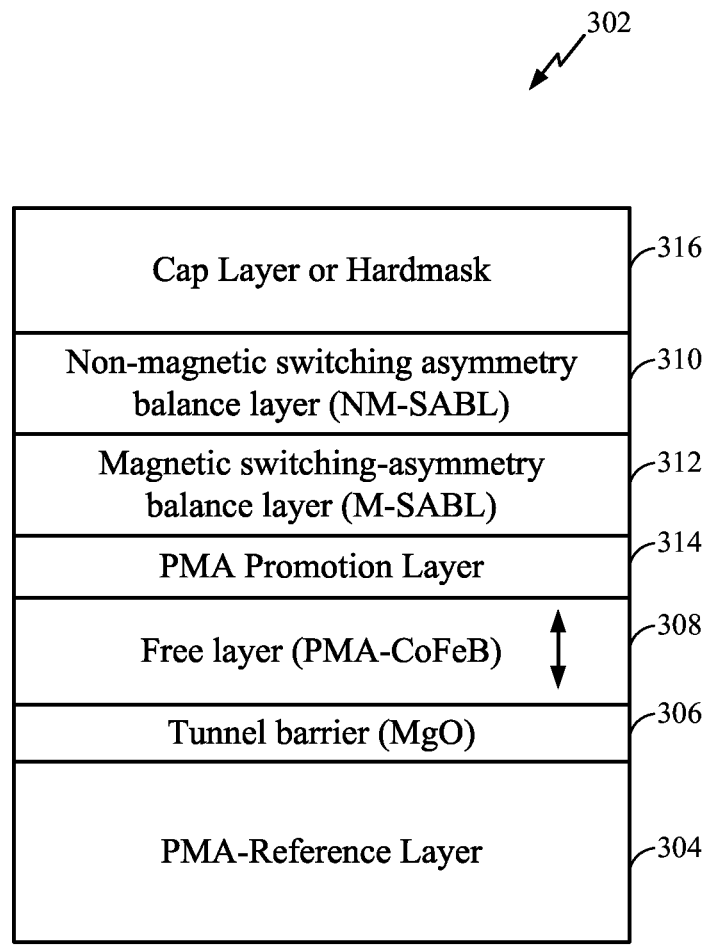
FIG. 3 is a cross-sectional diagram of a magnetic tunnel junction (MTJ) structure according to aspects of the present disclosure.

Configurations of the present disclosure can be used with MTJ devices having in-plain magnetic anisotropy as well as with MTJ devices having perpendicular magnetic anisotropy (PMA). FIG. 3 is a cross-sectional diagram of a particular illustrative configuration of layers of a representative magnetic tunnel junction (MTJ) structure 302 having perpendicular magnetic anisotropy, also referred to as a PMA. In general, the MTJ structure 302 includes a fixed layer 304 and a tunnel barrier layer 306 deposited on the fixed layer 304. The fixed layer 304, which is a PMA reference layer, may include a single layer of material such as PMA-CoFeB, PMA-CoFe, FePt, FePd or RE-TM alloy, for example. Alternatively, the fixed layer 304 may be configured in multiple layers of materials such as Co/Pt multi-layers, Co/Pd multi-layers, or Co/Ni multi-layers. According to aspects of the present disclosure, the fixed layer 304 may also be anti-ferromagnetic or synthetic anti-ferromagnetic materials such as CoFeB, CoFe/Ru/CoFeB, CoFe, CoCrPt/Ru/CoFeB, and/or (Co/Pt multi-layers)/Ru/CoFeB or other combinations of anti-ferromagnetic and synthetic anti-ferromagnetic materials, for example. The tunnel barrier layer 306 may be MgO.

A PMA free layer 308 is deposited on the tunnel barrier layer 306. The free layer 308 includes a PMA-CoFeB material, for example.

According to aspects of the present disclosure, a PMA promotion layer 314 is deposited over the free layer 308. The PMA promotion layer 314 may be a non-magnetic metal including Ru, Pd, Pt, Mg or Ta, or an oxide with low electrical resistance*area (RA), such as MgO, TaOx, TiOx or AlOx, for example. Alternatively the PMA promotion layer 314 may be a bi-layer of Ru/MgO, Pd/MgO or Pt/MgO, for example A non-magnetic switching asymmetry balance layer (NM-SABL) 310 is located near the free layer 308. In an illustrative configuration, the NM-SABL 310 may be a low resistance non-magnetic layer of a material such as ultra-thin graded oxide including MgO, AlOx, RuOx, TiOx, HfOx or TaOx, with electrical resistance*area (RA) less than 5 ohm*$\mu m^2$.

A magnetic switching-asymmetry balance layer (M-SABL) 312 may be near the free layer 308 and may be deposited between the free layer 308 and the NM-SABL 310. According to aspects of the present disclosure, the M-SABL 312 couples with the free layer 308 and the PMA promotion layer 314 to reduce Ic asymmetry. The M-SABL 312 may be a ferromagnetic material such as NiFe, Fe, FeB, Co, Ni or CoFe, for example. The MTJ structure 302 may also include a cap layer or hard mask 316 deposited over the MTJ layer stack.

Figure 4:
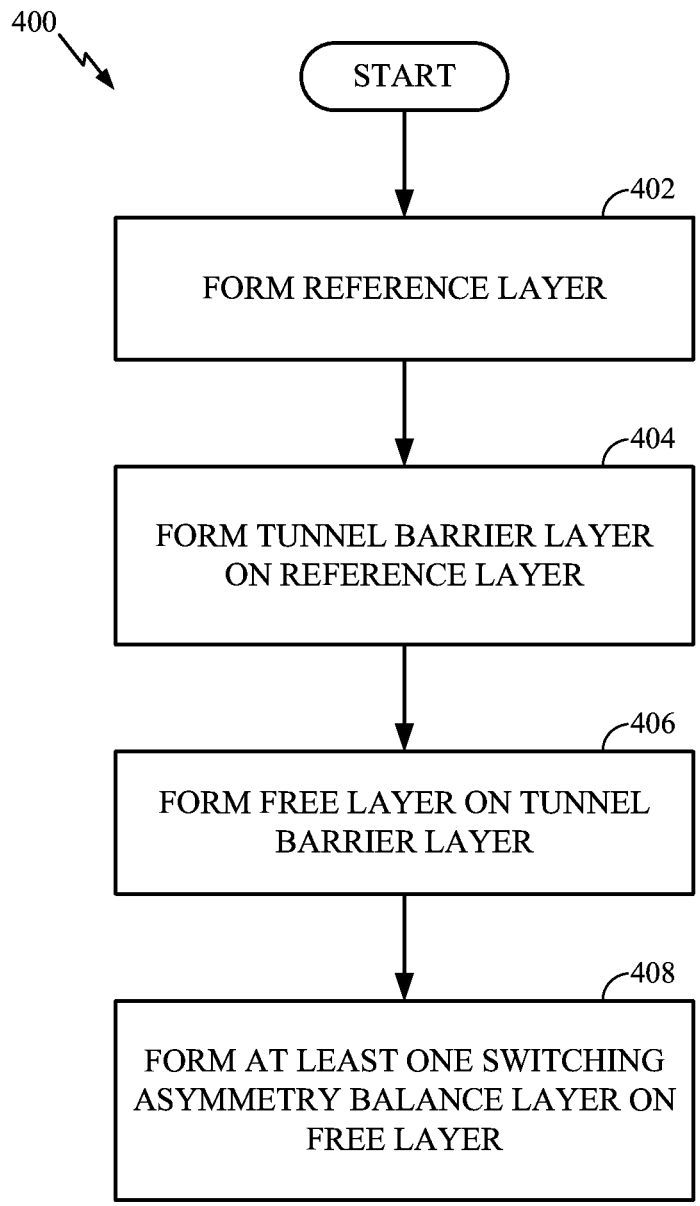
FIG. 4 is process flow diagram illustrating a method of reducing Ic asymmetry in STT-MRAM devices according to aspects of the present disclosure.

FIG. 4 is a process flow diagram illustrating a method of forming an MTJ for reducing Ic asymmetry in STT-MRAM devices according to aspects of the present disclosure. The method 400 includes forming a reference layer in block 402, forming a tunnel barrier layer on the reference layer in block 404, and forming a free layer on the tunnel barrier layer in block 406. The method further includes forming at least one switching asymmetry balance layer on the free layer in block 408. The switching asymmetry balance layer(s) are configured to reduce switching current asymmetry of the MTJ.

According to one aspect of the disclosure, a magnetic tunnel junction (MTJ) includes means for fixing magnetic polarization in a reference layer of the MTJ, means for altering magnetization direction in a free layer of the MTJ in response to a switching current, and means for reducing an asymmetry of the switching current. The means for fixing magnetic polarization in the reference layer may include anti-ferromagnetic and/or synthetic anti-ferromagnetic materials such as PtMn/(CoFe and/or CoFeB)/Ru/(CoFeB and/or CoFe), for example. The means for altering magnetization direction in a free layer of the MTJ may include a single ferromagnetic material such as CoFeB or may be formed as a multilayer material such as CoFeB/CoFe, CoFeB/NiFe, CoFeB/FeB or CoFeB/Ta/NiFe, for example. The means for reducing asymmetry of the switching current may include a non-magnetic switching asymmetry balance layer (NM-SABL) located near the free layer for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 5:
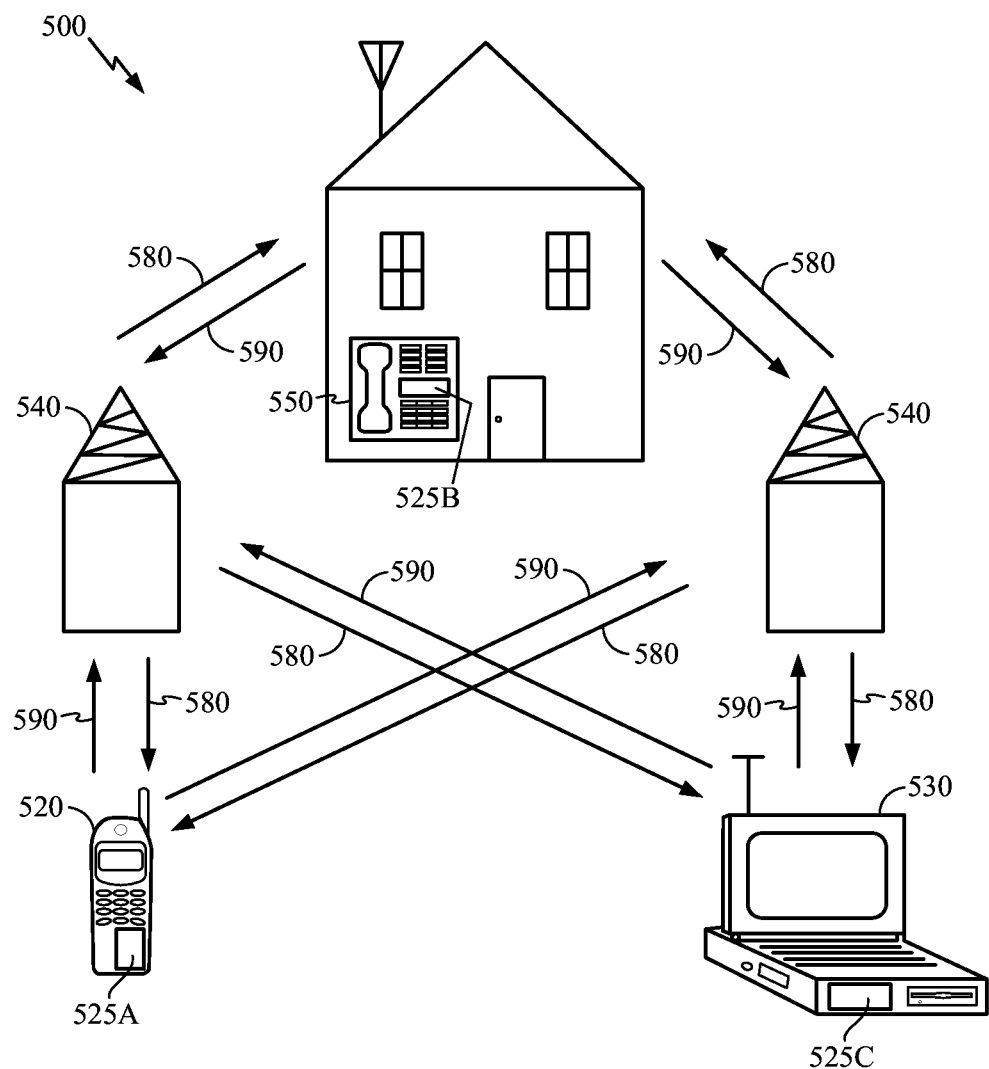
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C and 525B that include the disclosed MRAM. It will be recognized that other devices may also include the disclosed MRAM, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the teachings of the disclosure, the disclosure is not limited to these exemplary illustrated units. Aspects of the disclosure may be suitably employed in many devices which include MRAM.

Figure 6:
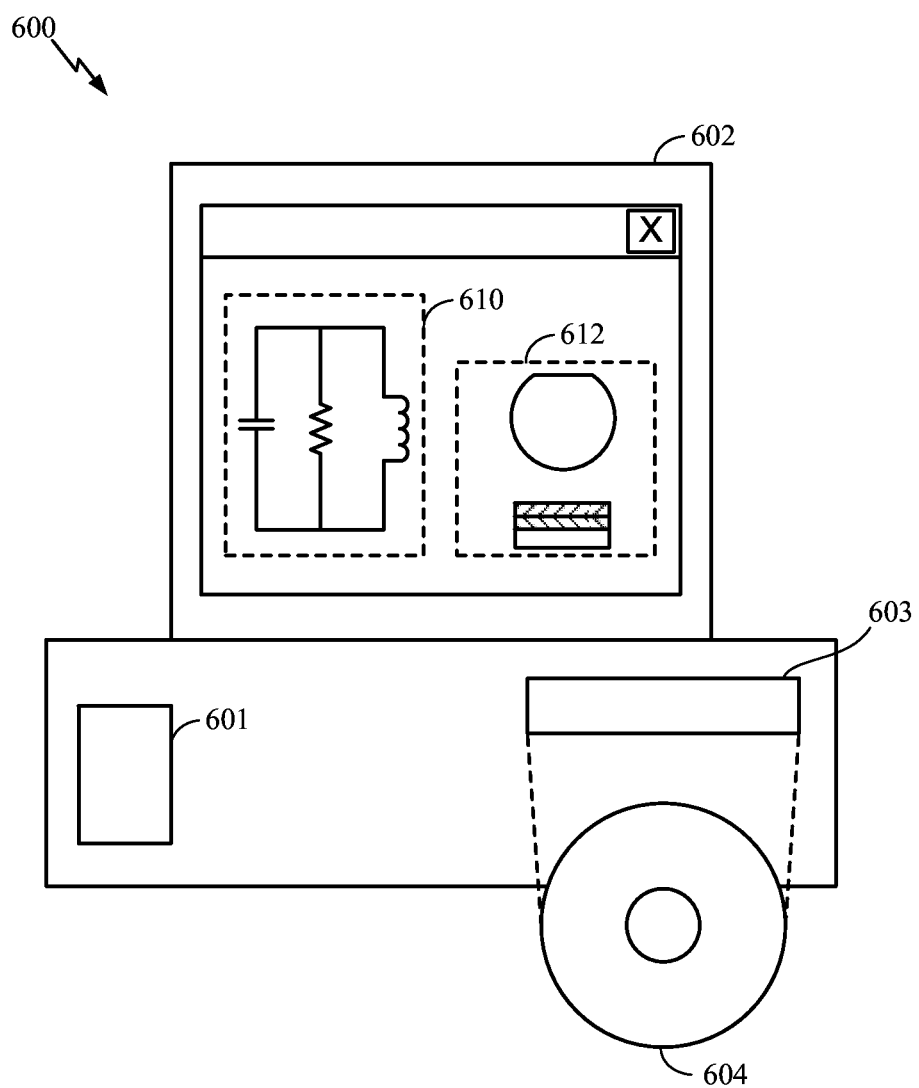
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the MRAM disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as an MRAM. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A magnetic tunnel junction (MTJ), comprising:
    a reference layer;
    a free layer;
    a tunnel barrier layer between the reference layer and the free layer; and
    at least one switching asymmetry balance layer (SABL) near the free layer, the at least on switching asymmetry balance layer configured to reduce switching current asymmetry of the MTJ, the at least one switching asymmetry balance layer including at least one non-magnetic switching asymmetry balance layer.

2. The MTJ of claim 1, in which:
    the free layer is configured to switch from a parallel state to an anti parallel state in response to a first switching current, and from the anti parallel state to the parallel state in response to a second switching current.

3. The MTJ of claim 2, in which the at least one switching asymmetry balance layer is configured to reduce the first switching current.

4. The MTJ of claim 1, in which the at least one switching asymmetry balance layer includes a magnetic switching asymmetry balance layer between the free layer and the at least one non-magnetic switching asymmetry balance layer.

5. The MTJ of claim 1, in which the at least one switching asymmetry balance layer includes a magnetic switching asymmetry balance layer, the at least one non-magnetic switching asymmetry balance layer being between the free layer and the magnetic switching asymmetry balance layer.

6. The MTJ of claim 1, further comprising a non-magnetic spacer layer between the switching asymmetry balance layer and the free layer.

7. The MTJ of claim 6, in which the non-magnetic spacer layer comprises a coupling tuning layer between the free layer and a magnetic switching asymmetry balance layer, the coupling tuning layer being configured to adjust magnetic coupling between the free layer and the magnetic switching asymmetry balance layer.

8. The MTJ of claim 6, in which the non-magnetic spacer layer comprises a perpendicular magnetic anisotropy (PMA) layer.

9. The MTJ of claim 1, integrated in at least one of a mobile phone, a set top box, a music player, a video player, an entertainment unit, a navigation device, a computer, a hand-held personal communication systems (PCS) unit, a portable data unit, and a fixed location data unit.

10. A method for forming a magnetic tunnel junction (MTJ), comprising:
    forming a reference layer;
    forming a tunnel barrier layer on the reference layer;
    forming a free layer on the tunnel barrier layer; and
    forming at least one switching asymmetry balance layer on the free layer, the at least one switching asymmetry balance layer configured to reduce switching current asymmetry of the MTJ, the at least one switching asymmetry balance layer including at least one non-magnetic switching asymmetry balance layer.

11. The method of claim 10, further comprising integrating the MTJ into at least one of a mobile phone, a set top box, a music player, a video player, an entertainment unit, a navigation device, a computer, a hand-held personal communication systems (PCS) unit, a portable data unit, and a fixed location data unit.

12. A magnetic tunnel junction (MTJ), comprising:
means for fixing magnetic polarization in a reference layer of the MTJ;
means for altering magnetization direction in a free layer of the MTJ in response to a switching current; and
means for reducing an asymmetry of the switching current, the asymmetry reducing means including at least one non-magnetic switching asymmetry balance layer.

13. The MTJ of claim 12, integrated in at least one of a mobile phone, a set top box, a music player, a video player, an entertainment unit, a navigation device, a computer, a hand-held personal communication systems (PCS) unit, a portable data unit, and a fixed location data unit.

14. A method for forming a magnetic tunnel junction (MTJ), comprising the steps of:
forming a reference layer;
forming a tunnel barrier layer on the reference layer;
forming a free layer on the tunnel barrier layer; and
forming at least one switching asymmetry balance layer on the free layer, the at least one switching asymmetry balance being is configured to reduce switching current asymmetry of the MTJ, the at least one switching asymmetry balance layer including at least one non-magnetic switching asymmetry balance layer.

15. The method of claim 14, further comprising the step of integrating the MTJ into at least one of a mobile phone, a set top box, a music player, a video player, an entertainment unit, a navigation device, a computer, a hand-held personal communication systems (PCS) unit, a portable data unit, and a fixed location data unit.

16. A magnetic tunnel junction (MTJ), comprising:
a perpendicular magnetic anisotropy (PMA) reference layer;
a perpendicular magnetic anisotropy (PMA) free layer;
a tunnel barrier layer between the PMA reference layer and the PMA free layer;
at least one switching asymmetry balance layer (SABL) near the PMA free layer, the at least on switching asymmetry balance layer configured to reduce switching current asymmetry of the MTJ; and
a perpendicular magnetic anisotropy (PMA) promotion layer between the switching asymmetry balance layer and the free layer, the at least one switching asymmetry balance layer including at least one non-magnetic switching asymmetry balance layer.

17. The MTJ of claim 16, in which:
the free layer is configured to switch from a parallel state to an anti parallel state in response to a first switching current, and from the anti parallel state to the parallel state in response to a second switching current; and
the at least one switching asymmetry balance layer is configured to reduce the first switching current.

18. The MTJ of claim 16, in which the at least one switching asymmetry balance layer includes a magnetic switching asymmetry balance layer between the free layer and the at least one non-magnetic switching asymmetry balance layer.

19. The MTJ of claim 16, integrated in at least one of a mobile phone, a set top box, a music player, a video player, an entertainment unit, a navigation device, a computer, a hand-held personal communication systems (PCS) unit, a portable data unit, and a fixed location data unit.

* * * * *